(12) United States Patent
Li

(10) Patent No.: US 7,679,433 B1
(45) Date of Patent: Mar. 16, 2010

(54) CIRCUIT AND METHOD FOR RF POWER AMPLIFIER POWER REGULATION AND MODULATION ENVELOPE TRACKING

(75) Inventor: Yushan Li, Longmont, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 99 days.

(21) Appl. No.: 11/701,747

(22) Filed: Feb. 2, 2007

(51) Int. Cl.
*H03F 3/38* (2006.01)
(52) U.S. Cl. .......................................... 330/10; 330/297
(58) Field of Classification Search ................... 330/10, 330/127, 285, 296, 297
See application file for complete search history.

(56) References Cited

U.S. PATENT DOCUMENTS

| 6,130,525 | A | 10/2000 | Jung et al. | |
|---|---|---|---|---|
| 6,148,220 | A | 11/2000 | Sharp et al. | |
| 6,624,711 | B1 * | 9/2003 | Khan et al. | 332/106 |
| 6,624,712 | B1 * | 9/2003 | Cygan et al. | 332/106 |
| 6,636,112 | B1 * | 10/2003 | McCune | 330/10 |
| 6,757,526 | B1 | 6/2004 | Sharp et al. | |
| 6,822,511 | B1 * | 11/2004 | Doherty et al. | 330/133 |
| 6,822,523 | B2 * | 11/2004 | Grosspietsch et al. | 332/149 |
| 6,850,044 | B2 | 2/2005 | Hansen et al. | |
| 6,897,730 | B2 * | 5/2005 | Dupuis et al. | 330/297 |
| 6,900,697 | B1 | 5/2005 | Doyle et al. | |
| 6,914,487 | B1 | 7/2005 | Doyle et al. | |
| 6,975,494 | B2 | 12/2005 | Tang et al. | |
| 7,038,536 | B2 | 5/2006 | Cioffi et al. | |
| 7,058,373 | B2 | 6/2006 | Grigore | |
| 7,071,668 | B2 | 7/2006 | Sasaki | |

OTHER PUBLICATIONS

Yushan Li, "System and Method for Providing a Highly Efficient Wide Bandwidth Power Supply for a Power Amplifier," U.S. Appl. No. 11/065,255, filed Feb. 24, 2005.
Hans P. Tuinhout et al., "Design and Characterization of a High-Precision Resistor Ladder Test Structure", IEEE Transactions on Semiconductor Manufacturing, vol. 16, No. 2, May 2003, pp. 187-193.
M. Z. Lee et al., "Characteristics of Vertical Thermal/PECVD Polysilicon Oxides Formed on the Sidewall of Polysilicon Films", Journal of the Electrochemical Society, 150 (1) pp. G28-G32 (2003).
Shylaja Katakam et al., "Resistor Matching Characterization for Process Development Using D/A Converter", Proc. IEEE 2001 Int. Conference on Microelectronics Test Structures, vol. 14, Mar. 2001, pp. 219-222.

(Continued)

*Primary Examiner*—Henry K Choe

(57) ABSTRACT

A power amplifier receives an input signal and generates an amplified output signal. A switching converter generates a regulated voltage and performs power control for the power amplifier. A linear amplifier performs modulation envelope control for the power amplifier. The switching converter may be coupled in series with the linear amplifier, and this circuit may operate in one of multiple modes. For example, the linear amplifier may output a tracked voltage to the power amplifier in GSM/polar EDGE mode, and the switching converter may output the regulated voltage to the power amplifier in WCDMA/UMTS mode. The linear amplifier could also output the tracked voltage in both modes, and a selector could select the appropriate feedback voltage for the switcher. The switching converter could also provide the regulated voltage directly to the power amplifier, and the linear converter could adjust a bias of the power amplifier to provide envelope tracking.

20 Claims, 7 Drawing Sheets

OTHER PUBLICATIONS

Abu H. M. Kamel et al., Obtaining Silicide Free Spacers by Optimizing Sputter Etch for Deep Submicron CMOS Processes, IEEE Transactions on Semiconductor Manufacturing, vol. 15, No. 3, Aug. 2002, pp. 350-354.

S.Y. Ku et al., "Pre-Metal Clean Optimization for Cluster Defect Prevention", 2001 IEEE, pp. 499-501.

Stefan Hausser et al., "Mismatch in Diffusion Resistors Caused by Photolithography", IEEE Transactions on Semiconductor Manufacturing, vol. 16, No. 2, May 2003, pp. 181-186.

* cited by examiner

CIRCUIT AND METHOD FOR RF POWER AMPLIFIER POWER REGULATION AND MODULATION ENVELOPE TRACKING

TECHNICAL FIELD

This disclosure is generally directed to power amplification. More specifically, this disclosure is directed to a circuit and method for radio frequency (RF) power amplifier power regulation and modulation envelope tracking.

BACKGROUND

Many circuits often employ power amplifiers, such as RF power amplifiers in handheld communication devices and other wireless devices. Power amplifiers are often controlled by adjusting a supply voltage $V_{CC}$ provided to the power amplifiers. A low drop out (LDO) linear amplifier is routinely used to generate the supply voltage $V_{CC}$ for a power amplifier.

Linear amplifiers can be very efficient when used to generate the supply voltage $V_{CC}$ for a power amplifier. For example, when the supply voltage $V_{CC}$ is very close to the power supply of a linear amplifier (often a battery voltage $V_{BATT}$), the linear amplifier is typically very efficient. However, when the supply voltage $V_{CC}$ is far below the battery voltage $V_{BATT}$, the linear amplifier may be very inefficient.

Linear amplifiers can also be designed to have extremely low noise and very high bandwidth. The low noise property is often important because there can be strict linearity requirements placed on power amplifiers, and any noise in the supply voltage $V_{CC}$ can translate into power amplifier output noise. The high bandwidth property is also often important because there can be spectral mask and time mask requirements in different communication systems, such as when the supply voltage $V_{CC}$ needs to be fully ramped up or down rapidly (such as within 10 μs) and when the supply voltage $V_{CC}$ needs to maintain its modulation dynamics.

Switching converters can provide high efficiency, but they typically have limited bandwidth. This may be due to several reasons, such as high switching losses at high switching frequencies, low resonant frequencies of external inductor-capacitor (LC) components, and control difficulties. Also, switching converters typically produce switching noise at the desired switching frequencies. As a result, typical switching converters are inappropriate for use in generating a supply voltage $V_{CC}$ requiring envelope tracking or short time masks for a power amplifier.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 17, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
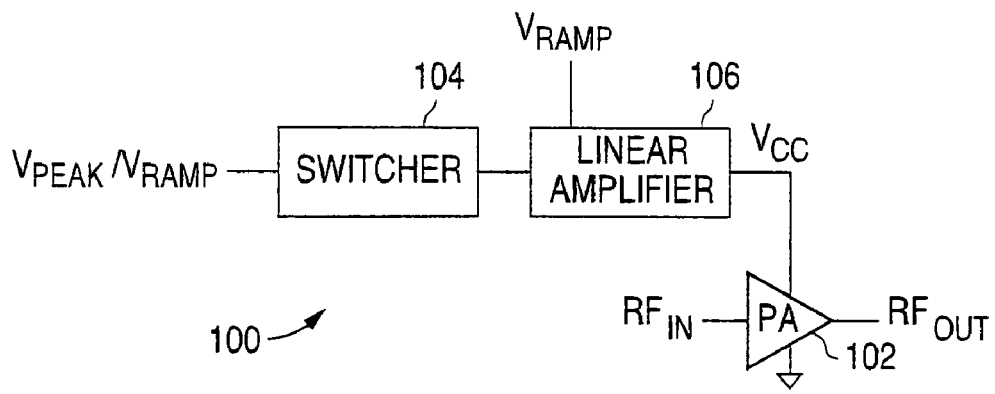
FIGS. 1 through 3 illustrate example circuits for power and modulation control of a power amplifier.
Figure 2:
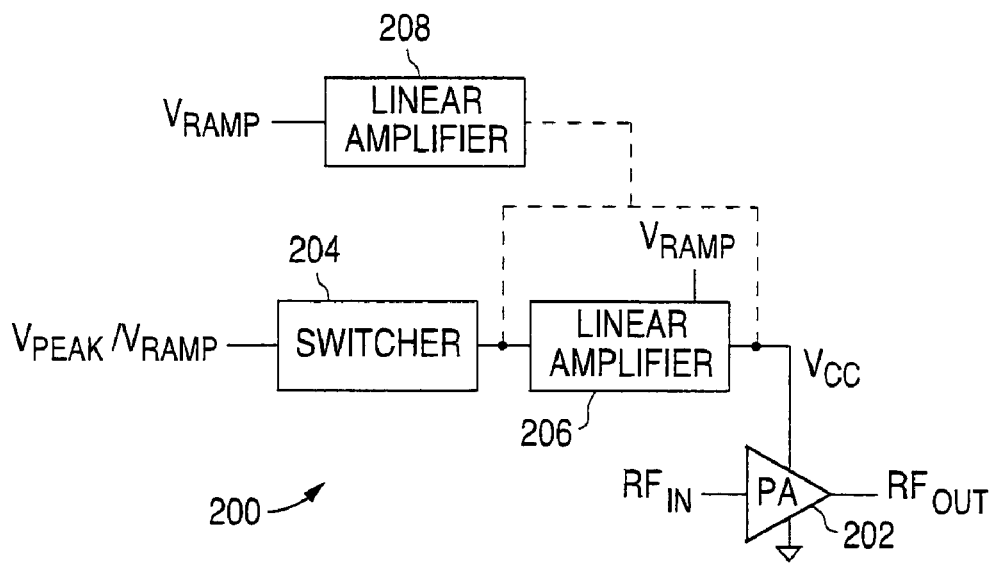
Figure 3:
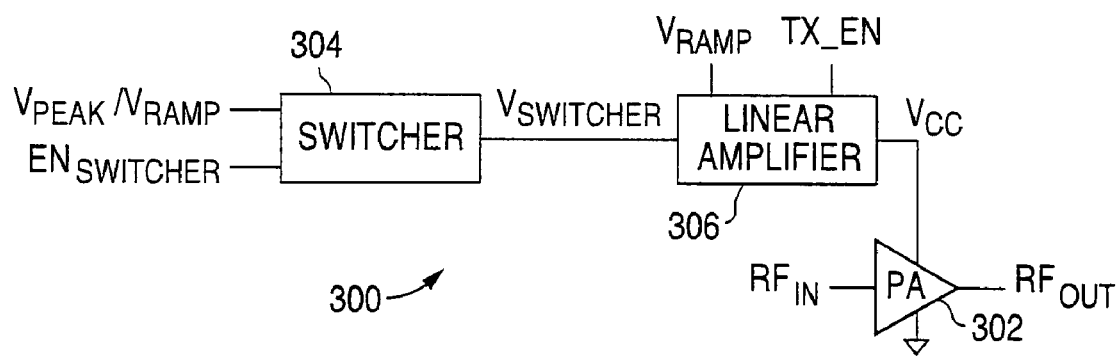

FIGS. 1 through 3 illustrate example circuits for power and modulation control of a power amplifier. As shown in FIG. 1, a circuit 100 includes a power amplifier 102, a switching converter or switcher 104, and a linear amplifier 106. The power amplifier 102 receives and amplifies an input signal. In this example, the power amplifier 102 represents an RF power amplifier that receives and amplifies an RF input signal $RF_{IN}$ to produce an RF output signal $RF_{OUT}$. In particular embodiments, the power amplifier 102 may also receive a constant bias. The power amplifier 102 represents any suitable structure for amplifying an input signal.

The power amplifier 102 is controlled by the switcher 104 and the linear amplifier 106, which are coupled in series. The switcher 104 generally performs power control (such as peak power regulation) and the linear amplifier 106 generally performs modulation control (such as envelope tracking) for the power amplifier 102.

The switcher 104 represents a switching converter capable of receiving a reference input voltage $V_{RAMP}$ or $V_{PEAK}$ and generating an output voltage. The voltage $V_{PEAK}$ could represent the peak value of the voltage $V_{RAMP}$ (or a scaled version thereof). $V_{PEAK}$ could be obtained in any suitable manner, such as by using $V_{RAMP}$ or by receiving $V_{PEAK}$ from a transceiver, baseband circuitry, or a power detector. The switcher 104 represents any suitable type of switching converter for generating a regulated output voltage, such as a buck, boost, or buck-boost switching converter.

The linear amplifier 106 receives and amplifies the reference input voltage $V_{RAMP}$ to generate a tracked output voltage. At least one component in the linear amplifier 106 (such as a transistor) is supplied by the voltage output by the switcher 104. The linear amplifier 106 represents any suitable amplifier for amplifying a voltage, such as an LDO linear amplifier. Although shown as a single amplifier here, multiple linear amplifiers 106 could be used in the circuit 100.

In this example embodiment, the switcher 104 may be capable of providing the full load current to the power amplifier 102, and the linear amplifier 106 can provide envelope tracking. For example, the switcher 104 may generate the peak power needed by the linear amplifier 106, and the linear amplifier 106 may fine tune its output to make sure its output tracks its reference input voltage $V_{RAMP}$. In this way, the circuit 100 can generate the supply voltage $V_{CC}$ for the power amplifier 102 in a highly efficient manner by combining the properties of switching converters and linear amplifiers. The linear amplifier 106 can be used to achieve low noise and high bandwidth, while the switcher 104 can be used to provide the supply voltage $V_{CC}$ with high efficiency.

As shown in FIG. 2, a circuit 200 includes a power amplifier 202, a switcher 204, and a linear amplifier 206. These components may operate in the same or similar manner as the corresponding components shown in FIG. 1. The circuit 200 also includes an additional linear amplifier 208, which can be coupled in parallel with the switcher 204 or with the switcher 204 and the linear amplifier 206. The linear amplifier 208 may function in the same or similar manner as the linear amplifier 206.

In this example embodiment, the switcher 204 may, but need not, handle the full load current to be provided to the power amplifier 202. For example, if the switcher 204 is capable of providing all of the necessary load current, the linear amplifier 208 can be shut off, such as by using a built-in systematic offset. If the switcher 204 is not capable of providing all of the necessary load current, the switcher 204 can act as a current source at its current limit, and the linear amplifier 208 can be activated to provide additional load current. This may occur, for example, when $V_{CC}$ is close to the supply voltage of the circuit 200 (such as a batter voltage $V_{BATT}$).

As shown in FIG. 3, a circuit 300 includes a power amplifier 302, a switcher 304, and a linear amplifier 306. The power amplifier 302 may operate in the same or similar manner as the other power amplifiers described above.

The switcher 304 in this example receives the reference input voltage $V_{RAMP}$ or $V_{PEAK}$ and an enable signal $EN_{SWITCHER}$, and the linear amplifier 306 receives the reference input voltage $V_{RAMP}$ and an enable signal TX_EN. The enable signal $EN_{SWITCHER}$ can be used to enable and disable the switcher 304, and the enable signal TX_EN can be used to enable and disable the linear amplifier 306. The use of the enable signal $EN_{SWITCHER}$ may, for example, allow the switcher 304 to be disabled to save power when the power amplifier 302 is disabled. The enable signal $EN_{SWITCHER}$ can be provided ahead of time (ahead of the enable signal TX_EN) so that the switcher 304 can reach a steady state before the linear amplifier 306 is activated. In this way, a voltage supplied by the switcher 304 to a transistor in the linear amplifier 306 may be available when the linear amplifier 306 is activated.

Figure 4:
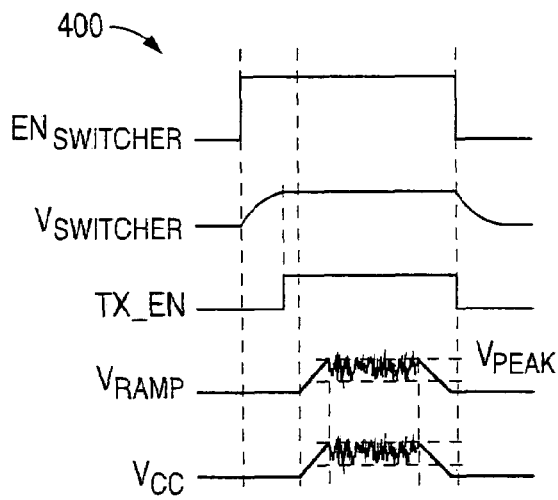
FIG. 4 illustrates an example timing diagram for the circuits of FIGS. 1 through 3.

FIG. 4 illustrates an example timing diagram 400 for the circuits of FIGS. 1 through 3. As shown here, $V_{RAMP}$ can transition from a low value (such as 0V) to a high value (such as 1.55V) within a given amount of time (such as 10 μs). If $V_{RAMP}$ is used to convey modulation information, $V_{RAMP}$ can vary near its high value and has a peak voltage $V_{PEAK}$. Otherwise, $V_{RAMP}$ can represent a flat or steady voltage. The change in $V_{RAMP}$ may cause a corresponding change in $V_{CC}$, which transitions from a low value (such as 0V) to a high value (such as 3.5V) within approximately the same amount of time. Again, $V_{CC}$ can vary if it contains modulation information. The transition in $V_{CC}$ results in a load current being supplied to the power amplifier, and the load current can transition from a low value (such as 0 A) to a high value (such as 1.2 A) within approximately the same amount of time. $V_{RAMP}$, $V_{CC}$, and the load current could remain at their high levels for any suitable amount of time (such as 542.8 μs). $V_{RAMP}$ can then transition from its high value to its low value, causing $V_{CC}$ and the load current to transition to their low values. These transitions can also occur within a given amount of time (such as 10 μs).

If enable signals (such as $EN_{SWITCHER}$ and TX_EN) are used in the circuit (such as in circuit 300), the enable signals may behave as shown in FIG. 4. The enable signal $EN_{SWITCHER}$ transitions high, causing the output of the switcher 304 (denoted $V_{SWITCHER}$) to increase and eventually reach a steady state. At that point, the enable signal TX_EN can transition high, enabling the linear amplifier 306. $V_{RAMP}$, $V_{CC}$, and the load current can then behave as described above.

Figure 5:
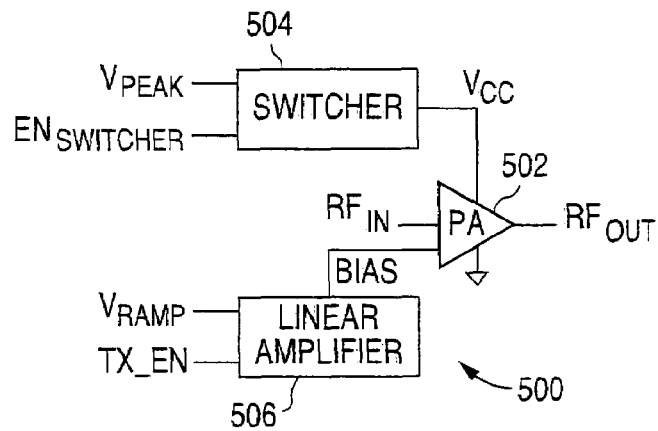
FIG. 5 illustrates another example circuit for power and modulation control of a power amplifier.

FIG. 5 illustrates another example circuit 500 for power and modulation control of a power amplifier. As shown in FIG. 5, the circuit 500 includes a power amplifier 502, a switcher 504, and a linear amplifier 506. In this example, the switcher 504 performs peak power regulation for the power amplifier 502, and the linear amplifier 506 performs envelope tracking for the power amplifier 502. However, the switcher 504 in this example provides $V_{CC}$ directly to the power amplifier 502, and the linear amplifier 506 performs envelope tracking via a bias control of the power amplifier 502.

In this example embodiment, if the switcher's switching noise can be controlled to an acceptable level (such as through large LC components and/or using spread-spectrum techniques), $V_{CC}$ can be provided by the switcher 504. This architecture achieves envelope tracking through bias control of the power amplifier 502 using the linear amplifier 506. Depending on the implementation, the input signal $RF_{IN}$ could have a constant envelope with the power amplifier bias control, or the input signal $RF_{IN}$ (or the input signal combined with the bias) could be controlled for the modulation envelope instead of the bias port of the power amplifier 502.

The circuit 500 could potentially provide higher efficiency and may be simpler in terms of implementation. However, the power amplifier 502 may require higher linearity since the power amplifier's bias control may contain modulation. Also, the power amplifier's efficiency may still be quite good because the $V_{CC}$ level can be controlled close to the bias peak level. Further, the switcher 504 may have to meet any spectral mask requirements even at low frequencies.

In general, the switcher in the various circuits shown and described above may be efficient over a wide output range, but the switcher may have limited bandwidth for modulation control (envelope tracking). On the other hand, the linear amplifier (or one of the linear amplifiers) in the circuits may be efficient if its output and its input (or its supply from the switcher) are close. The linear amplifier may be inefficient if its output is much lower than its input, but the linear amplifier can be designed to have high bandwidth. This may make it much easier to achieve envelope tracking or other modulation control and still properly handle the power provided by the switcher.

In these example embodiments, $V_{CC}$ may represent the high power provided to a power amplifier. If a switcher and linear amplifier are coupled in series (as in FIGS. 1 through 3), the switcher may be used to generate the peak power needed for the linear amplifier, and the series-coupled linear amplifier fine tunes its output to make sure its output tracks its reference ($V_{RAMP}$). Both the switcher and the linear amplifier in this case handle the required power since they are coupled in series. If modulation control is handled by adjusting the power amplifier's bias (as in FIG. 5), the linear amplifier used for bias control may handle much less current than the load current associated with $V_{CC}$.

As described in more detail below, the circuits shown and described above could be used in devices or systems that support various communication standards. For example, the circuits could be used in a Global System for Mobile communication (GSM), polar Enhanced Data rates for Global Evolution (EDGE), or other device or system. GSM uses a constant envelope, so $V_{RAMP}$ may contain no modulation and could be flat when it reaches its high value. In polar EDGE, 8PSK modulation is used with a peak-to-average ratio of about 3.5 dB. In order to help maintain high efficiency of the linear amplifier, the output of the switcher is controlled so that it is close to the required $V_{CC}$. In GSM, the steady states of $V_{PEAK}$ and $V_{RAMP}$ may be the same since the envelope is constant, but internally a small offset could be built into the switcher reference to accommodate the drop in the linear amplifier between its input and output. When used in GSM devices or in GSM mode, the linear amplifier providing $V_{CC}$ to the power amplifier acts as a switch (its input and output may be very close) in the steady state to maintain its high efficiency. That linear amplifier also has linear control during the ramp up/ramp down periods to meet any time mask requirements. In polar EDGE, it may be difficult to meet both the power control range (about 30 dB) and modulation dynamics (about 17 dB) by the switcher alone, so the switcher handles the dB power control, and the linear amplifier coupled in series handles the 17 dB modulation dynamics.

The various circuits shown and described above could also be used in Code Division Multiple Access (CDMA) or Wideband CDMA (WCDMA) devices and systems. As an example, WCDMA is used in Universal Mobile Telecommunications System (UMTS) devices and systems. When used in WCDMA/UMTS devices or in WCDMA/UMTS mode, modulation can be handled using a series-coupled switcher and linear amplifier as shown in FIGS. 1 through 3. WCDMA/UMTS modulation can also be handled as shown in FIG. 5 by allowing the switcher to generate $V_{CC}$ and perform power control and by allowing the linear amplifier to perform modulation control via the power amplifier's bias and/or its RF input ($RF_{IN}$).

Although various ones of FIGS. 1 through 5 have illustrated examples of circuits for power and modulation control of a power amplifier, various changes may be made to these figures. For example, various features from different circuits could be combined into a single circuit, such as when a parallel linear amplifier is used in FIG. 3. Also, the timing diagram in FIG. 4 is for illustration only. The associated circuits could operate in any other or additional manner. In addition, other embodiments of these circuits could be used without departing from the scope of this disclosure.

FIGS. 6 through 16 illustrate more detailed example circuits for power and modulation control of a power amplifier. The embodiments of the circuits in FIGS. 6 through 16 are for illustration and explanation only. Other embodiments of the circuits could be used without departing from the scope of this disclosure.

Figure 6:
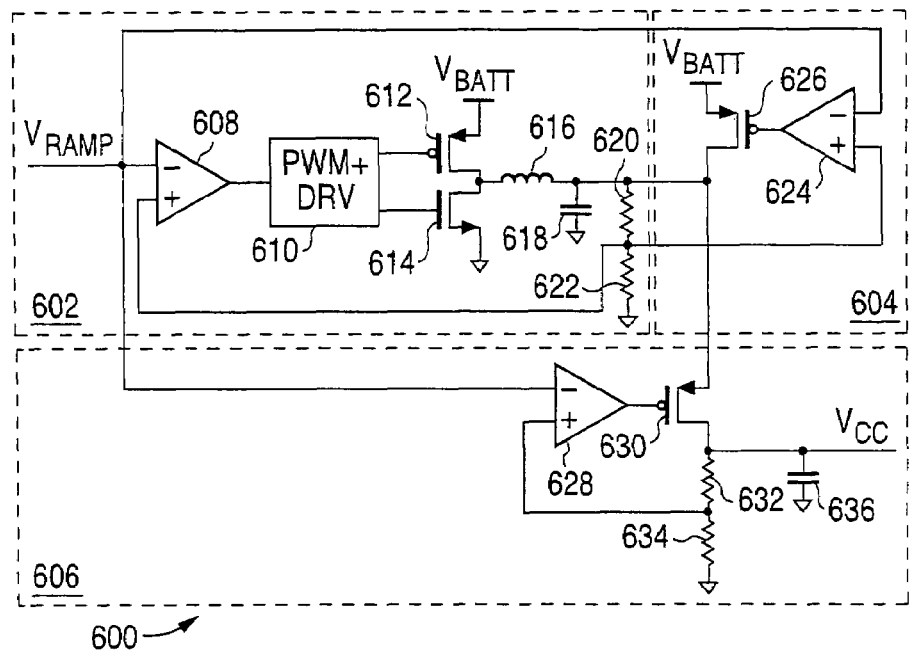
FIGS. 6 through 16 illustrate more detailed example circuits for power and modulation control of a power amplifier.

As shown in FIG. 6, a circuit 600 includes a switcher 602 and two linear amplifiers 604-606. In this example, the switcher 602 includes a difference amplifier 608, a pulse width modulator (PWM) and driver 610, a p-channel metal oxide semiconductor (PMOS) transistor 612, an n-channel metal oxide semiconductor (NMOS) transistor 614, an inductor 616, a capacitor 618, and two resistors 620-622. The difference amplifier 608 receives the reference input voltage $V_{RAMP}$ and a voltage generated between the resistors 620-622 (forming a control loop) as inputs. The difference amplifier 608 generates an output based on the two inputs. The pulse width modulator and driver 610 generates outputs having a pulse width defined by the output of the difference amplifier 608. The outputs of the pulse width modulator and driver 610 are supplied to the gates of the transistors 612-614, which couple the inductor 616, capacitor 618, and resistors 620-622 to either a supply voltage $V_{BATT}$ or ground. Here, the switcher 602 may represent a buck switcher.

The linear amplifier 604 includes a difference amplifier 624 and a PMOS transistor 626. The difference amplifier 624 receives the reference input voltage $V_{RAMP}$ and the voltage generated between the resistors 620-622 as inputs and generates an output based on the inputs. The transistor 626 receives the output of the difference amplifier 624 at its gate.

The linear amplifier 606 includes a difference amplifier 628, a PMOS transistor 630, two resistors 632-634, and a capacitor 636. The difference amplifier 628 receives the reference input voltage $V_{RAMP}$ and a voltage generated between the resistors 632-634 (forming a control loop) as inputs and generates an output based on the inputs. The output of the difference amplifier 628 is supplied to the gate of the transistor 630, which controls the output of the linear amplifier 606 such that the output voltage $V_{CC}$ tracks the reference input voltage $V_{RAMP}$.

In this example, the source of the transistor 630 in the linear amplifier 606 is supplied by the switcher 602. The switcher 602 and possibly the linear amplifier 604 are responsible for generating $V_{CC}$, and the linear amplifier 606 can fine tune $V_{CC}$ to provide any necessary envelope tracking. The linear amplifier 606 may also provide high bandwidth and ramp-down of the supply voltage $V_{CC}$ in the required time (such as 10 μs). The linear amplifier 604 can charge up the switcher output filter capacitance (capacitor 618) in a short time to meet a ramp-up time mask and to provide the load current if the current limit of the switcher 602 is reached.

In order to make these three components work together, built-in offsets can be used to switch the control loops automatically. The offsets can be achieved by the individual $V_{RAMP}$ reference, the individual feed back signals, or the individual difference amplifiers of the control loops. The linear amplifier 606 may have no offset so that the supply voltage $V_{CC}$ is at the desired level. The linear amplifier 604 and the switcher 602 may have offsets so that their combined output in regulation is slightly higher than the supply voltage $V_{CC}$. The switcher 602 may have a higher offset than the linear amplifier 604 so that the linear amplifier 604 is in open loop when the switcher 602 is in regulation. This helps to ensure that the load current is provided by the switcher 602 if the switcher 602 can handle the load current, and in this case high efficiency is maintained.

The switcher 602 can be current-limited and handle certain load currents due to the inductor series resistance and the switch resistance. If the load current is higher than the switcher current limit, the linear amplifier 604 attempts to close its loop to provide additional load current beyond the switcher limit. If the supply voltage $V_{CC}$ is required to be very close to the supply voltage $V_{BATT}$ (such as during a high power low battery condition), both linear amplifiers 604-606 may be in the drop out condition. In this case, the total RDSon resistance (the resistance of the two transistors in the amplifiers 604-606) may represent the sum of the RDSon resistances of the two individual transistors.

In this example, the switcher output can be mostly charged by the linear amplifier 604 during ramp up, and the switcher 602 can take care of the rest. The switcher output capacitor 618 could be much larger than the output capacitor 636 of the linear amplifier 606 to achieve low switching noise and low supply overhead for the linear amplifier 606 (with the help of the linear amplifier 604).

Figure 7:
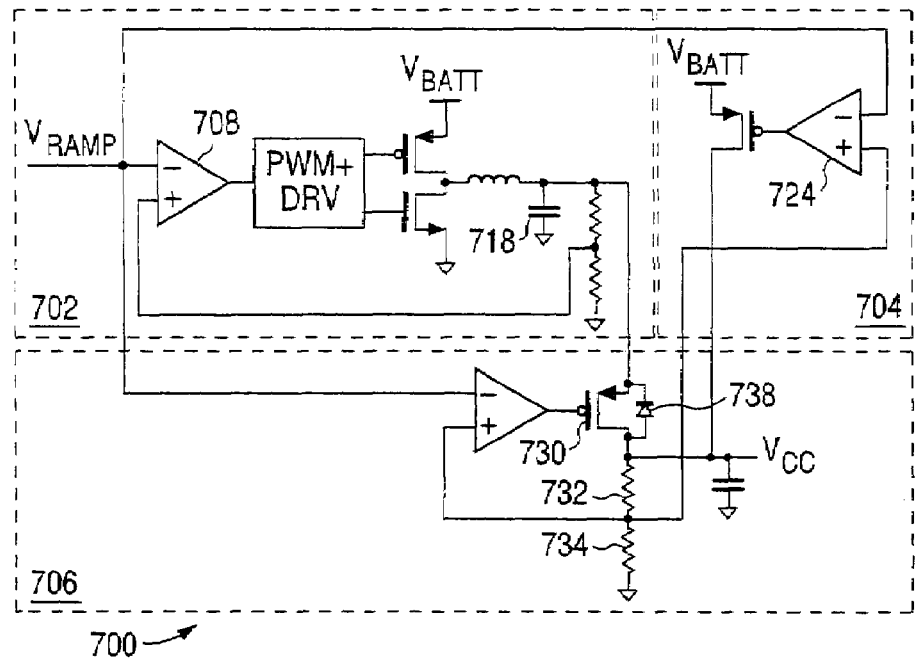

As shown in FIG. 7, a circuit 700 includes a switcher 702 and two linear amplifiers 704-706. The circuit 700 in FIG. 7 is similar to the circuit 600 in FIG. 6. However, in this example, the output of the switcher 702 is not coupled to the linear amplifier 704, and one input of a difference amplifier 724 in the linear amplifier 704 is coupled between two resistors 732-734 in the linear amplifier 706. Also, a diode 738 represents the built-in body diode of a PMOS transistor 730 in the linear amplifier 706.

In this example, both the switcher 702 and the linear amplifier 704 drive the supply voltage $V_{CC}$. Without the linear amplifier 704, the switcher 702 could take more than the required ramp time to reach its steady state value, meaning the supply voltage $V_{CC}$ might not be able to meet the time mask requirements. In FIG. 7, the linear amplifier 704 can help to charge up the output capacitor 718 of the switcher 702 through the diode 738. The linear amplifier 704 may charge up the switcher's output to its regulation value minus the diode voltage, and the switcher 702 may then charge its output to the desired level (such as a level higher than $V_{CC}$).

In this embodiment, the switcher's difference amplifier 708 may have a built-in offset compared with $V_{RAMP}$. For the switcher 702 to provide the load current in normal conditions, the linear amplifier 704 may also have a built-in offset so that its regulated or tracked voltage is slightly lower than the desired supply voltage $V_{CC}$.

If the switcher 702 can provide the entire load current, the system is efficient because the switcher 702 has efficiency and the linear amplifier 706 is efficient with the output $V_{CC}$ designed close to its supply (the output of the switcher 702). When there is a heavy load condition, the switcher 702 may reach its current limit, and a rest current can be provided by the linear amplifier 704. In this case, the switcher 702 and the linear amplifier 706 could be in bypass mode (100% or fully on), and the linear amplifier 704 may be in regulation. The regulated output of the linear amplifier 704 could be slightly lower than the desired level of $V_{CC}$, but the slight difference may be tolerable. In an extremely heavy load condition, the linear amplifier 704 may be in the bypass mode (a drop out condition) as well, but the drop out condition is improved since the linear amplifier 704 is in parallel with the other path.

Figure 8:
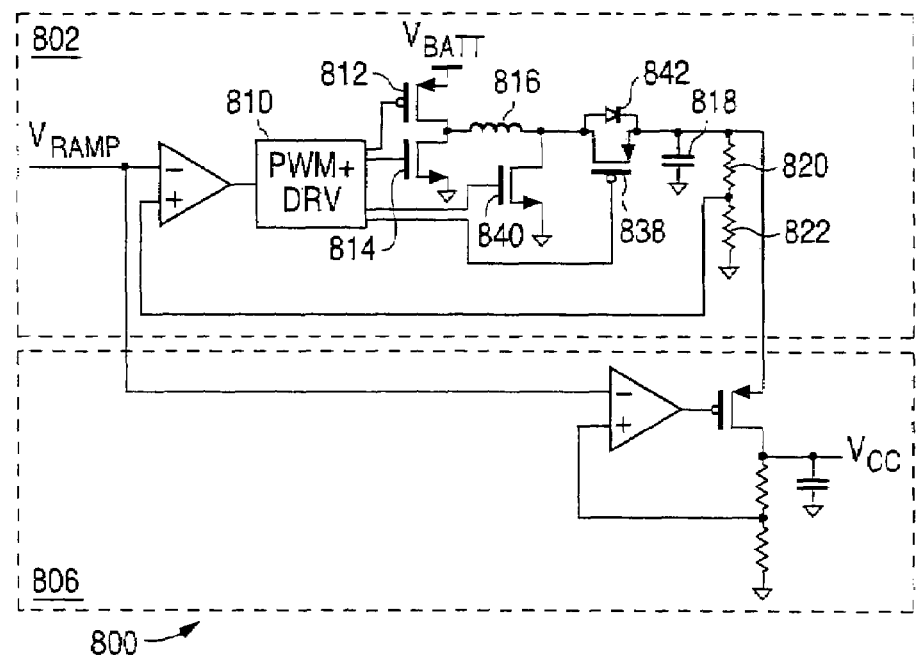

As shown in FIG. 8, a circuit 800 includes a switcher 802 and a linear amplifier 806. The linear amplifier 806 in FIG. 8 may be the same as or similar to the linear amplifiers described above.

In this example embodiment, the switcher 802 can make the supply voltage $V_{CC}$ possibly higher than the supply voltage $V_{BATT}$, which could be required during low battery conditions or with lower battery voltages in newer battery chemistry. In other word, the power amplifier receiving the supply voltage $V_{CC}$ could be fully powered even with a low $V_{BATT}$. The linear amplifier 806 in FIG. 8 helps to achieve high bandwidth.

In this example, the switcher 802 includes a pulse width modulator and driver 810, transistors 812-814, an inductor 816, a capacitor 818, and two resistors 820-822. These may operate in the same or similar manner as the corresponding components in FIGS. 6 and 7. The switcher 802 also includes two additional transistors 838-840 and a diode 842, which as examples could represent an external Schottky diode or the body diode of the transistor 838. These elements support the ability of the switcher 802 to operate in buck, boost, or buck-boost mode.

Figure 9:
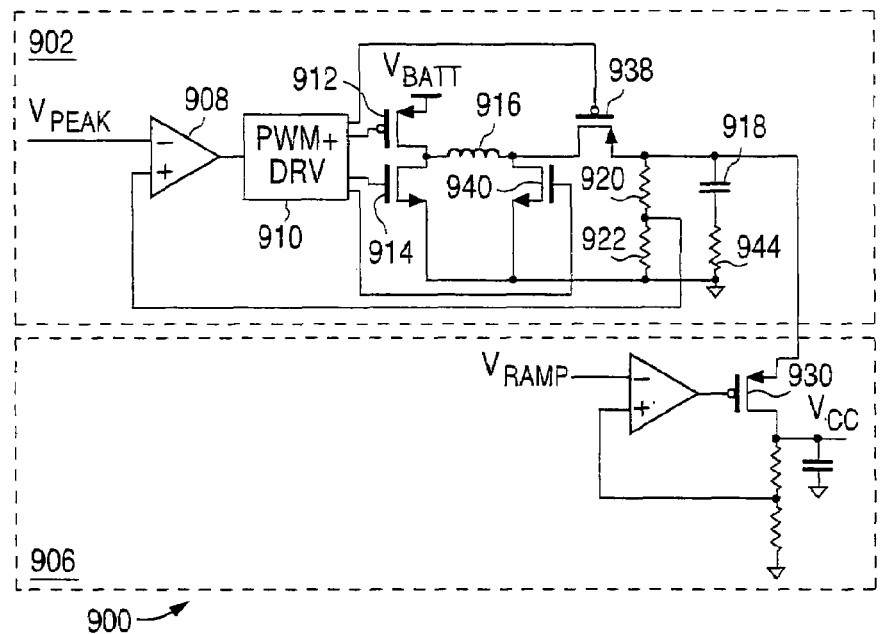

As shown in FIG. 9, a circuit 900 includes a switcher 902 and a linear amplifier 906. The linear amplifier 906 in FIG. 9 may be the same as or similar to the linear amplifiers discussed above.

In this example embodiment, the switcher 902 includes a difference amplifier 908, a pulse width modulator and driver 910, two transistors 912-914, an inductor 916, a capacitor 918, and two resistors 920-922. The switcher 902 also includes two additional transistors 938-940 and a resistor 944 coupled in series with the capacitor 918.

In this embodiment, the difference amplifier 908 does not receive $V_{RAMP}$ as a reference input voltage. Rather, the difference amplifier 908 receives $V_{PEAK}$ as the reference input voltage. The voltage $V_{PEAK}$ may represent the peak power requirement, and it may be set slightly higher than the steady state value or peak value of $V_{RAMP}$.

In the series architecture shown here, high bandwidth and low switching noise requirements can be worked out independently from the two separate stages. For example, a relatively large LC filter in the switcher 902 can be designed to meet receiver band noise requirements, while the linear amplifier 906 can provide the bandwidth and time mask.

If $V_{PEAK}$ is slightly higher than the peak of $V_{RAMP}$, this may help to ensure that the linear amplifier 906 is efficient, so the total efficiency (the product of the switcher and linear amplifier's efficiencies) is still high. This scheme can also be applied where $V_{PEAK}$ is constant and $V_{RAMP}$ represents the modulation.

A practical switcher 902 may have a minimum output voltage limitation. In this architecture, $V_{PEAK}$ can be set to meet this requirement, and the linear amplifier 906 may be able to maintain a lower value of $V_{CC}$. In addition, the switcher 902 could be configured as either a buck switching converter or a boost switching converter by sensing a battery voltage or by using a single control loop with smooth transitions between buck and boost modes (rather than using a buck-boost switcher, which could require a larger inductor). The boost function allows the power amplifier to work properly with a very low battery voltage. The boost function can be activated to meet any full power requirements of the circuit 900.

Figure 10:
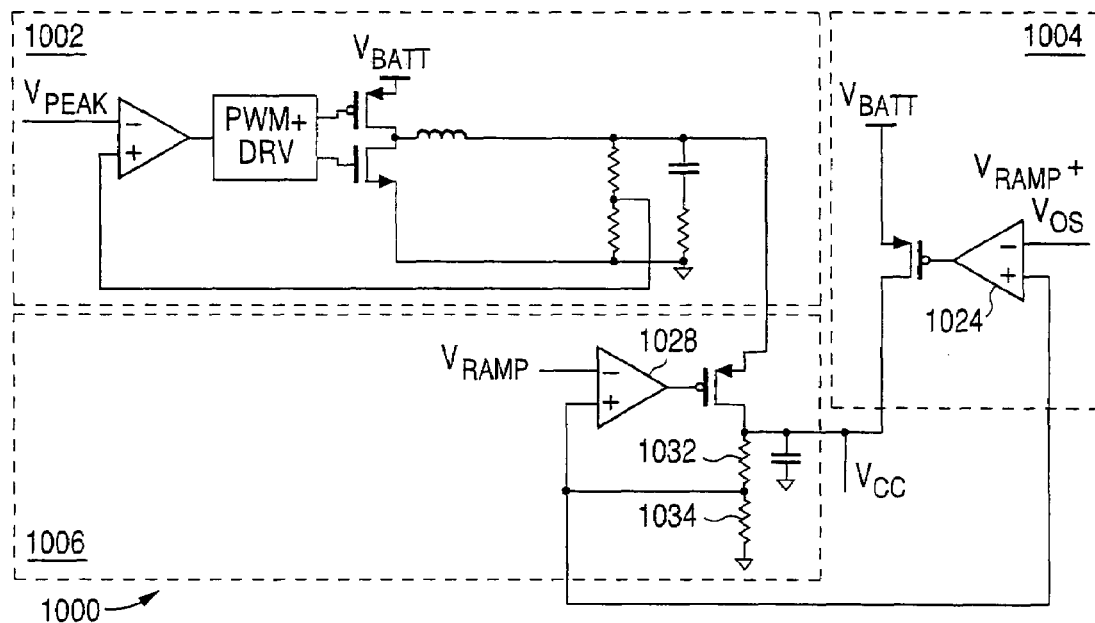

As shown in FIG. 10, a circuit 1000 includes a switcher 1002 and two linear amplifiers 1004-1006. The switcher 1002 may operate in the same or similar manner as the switchers described above. The switcher 1002 could, for example, represent a buck switching converter. The linear amplifier 1004 includes a difference amplifier 1024 that receives $V_{RAMP}$ plus an offset voltage $V_{OS}$ as one input and a voltage from the linear amplifier 1006 as another input. The linear amplifier 1006 includes a difference amplifier 1028 that receives $V_{RAMP}$ and a voltage generated between two resistors 1032-1034 as inputs.

In this example embodiment, the linear amplifier 1004 is used in parallel with the switcher 1002. In this approach, the switcher 1002 does not need to handle the full load current, meaning it can use relatively small output devices. The linear amplifier 1004 can be active when $V_{CC}$ is close to $V_{BATT}$ and the switcher 1002 cannot provide the full load current. If the switcher 1002 is capable of providing all of the load current, the linear amplifier 1004 can be turned off, such as by using a built-in systematic offset setup in the two parallel paths. If the switcher 1002 is not capable of providing all of the load current, the switcher 1002 can act as a current source operating at its current limit, and the linear amplifier 1004 can be activated to provide additional load current. Here, the switcher's output devices and the output device of the linear amplifier 1006 can all be relatively small, while the output device of the linear amplifier 1004 can be larger to provide high efficiency for the full load condition.

Various ones of these circuits can be used in any suitable devices or systems, such as devices or systems requiring efficiency and high bandwidth. For example, the circuits could be used in a GSM/polar EDGE device or system or in a WCDMA/UMTS device or system. It is also possible to construct circuits that can support multiple modes of operation. Examples of these types of circuits are shown in FIGS. 11 and 12.

Figure 11:
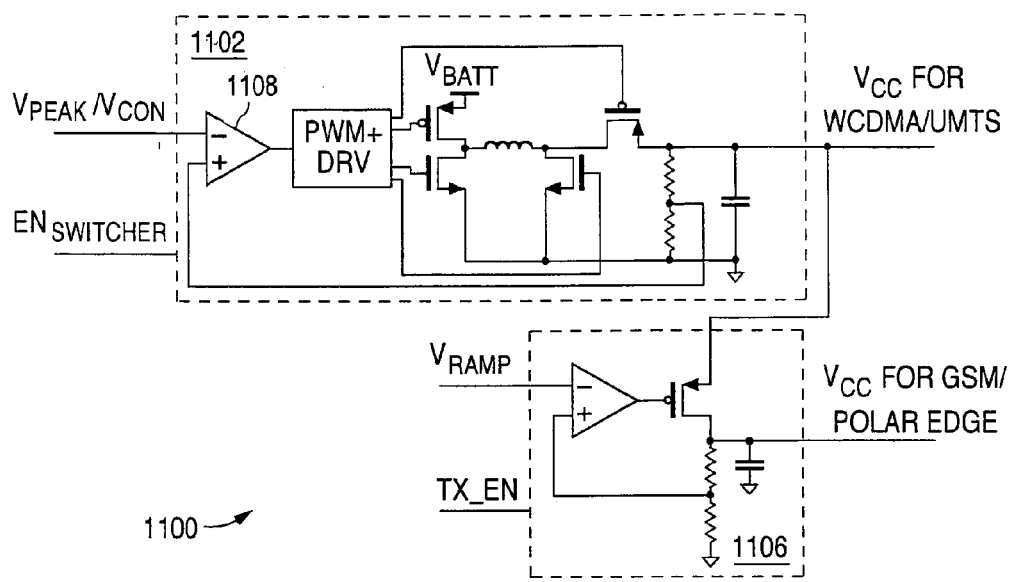

As shown in FIG. 11, a circuit 1100 includes a switcher 1102 and a linear amplifier 1106. The switcher 1102 may operate in the same or similar manner as the switcher 902. Also, the linear amplifier 1106 may operate in the same or similar manner as various linear amplifiers described above. In addition, the enable signals $EN_{SWITCHER}$ and TX_EN have been added for illustrative purposes.

In this example embodiment, the output of the switcher 1102 could be used as $V_{CC}$ for a power amplifier when a device (such as a mobile communication device) is operating in WCDMA/UMTS mode. The output of the linear amplifier 1106 could be used as $V_{CC}$ for a power amplifier when the device is operating in GSM/polar EDGE mode. A difference amplifier 1108 in the switcher 1102 may receive $V_{PEAK}$ or $V_{CON}$, where $V_{PEAK}$ is generally associated with GSM/polar EDGE mode and $V_{CON}$ is generally associated with WCDMA/UMTS mode. In this way, the circuit 1100 supports multiple modes of operation in the device.

Figure 12:
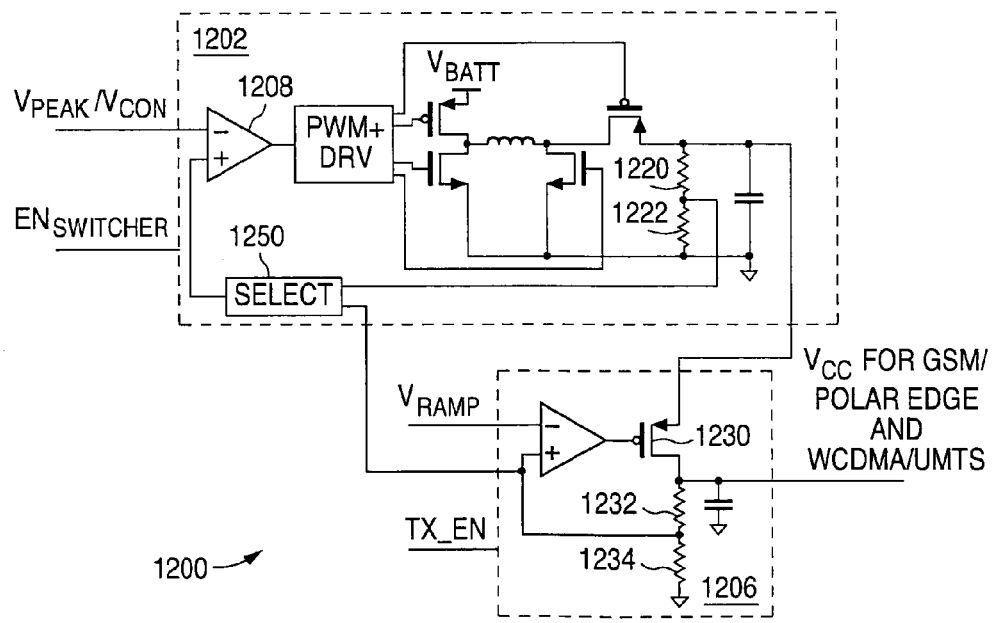

As shown in FIG. 12, a circuit 1200 includes a switcher 1202 and a linear amplifier 1206. The circuit 1200 of FIG. 12 is similar to the circuit 1100 of FIG. 11. However, in FIG. 12, the linear amplifier 1206 provides $V_{CC}$ in both WCDMA/UMTS and GSM/polar EDGE modes. Also, a select unit 1250 is included in the switcher 1202 to select one of the inputs to the difference amplifier 1208. In this example, the select unit 1250 receives two voltages, one generated between resistors 1220-1222 in the switcher 1202 and another generated between resistors 1232-1234 in the linear amplifier 1206. In this way, the select unit 1250 can provide the proper input to the difference amplifier 1208, depending on whether the circuit 1200 is operating in WCDMA/UMTS mode or GSM/polar EDGE mode. Again, the circuit 1200 supports multiple modes of operation in the device in this manner. The select unit 1250 could represent any structure for selecting between inputs, such as a multiplexer. When operating in the WCDMA/UMTS mode, the PMOS transistor 1230 in the linear amplifier 1206 can be set to a bypass mode as a switch for high efficiency.

Figure 13:
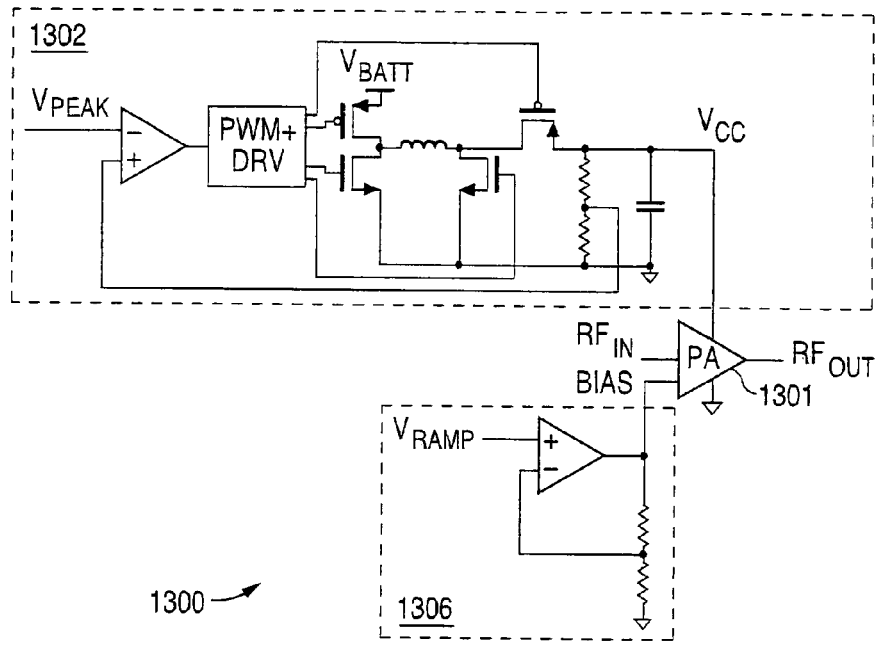
Figure 14:
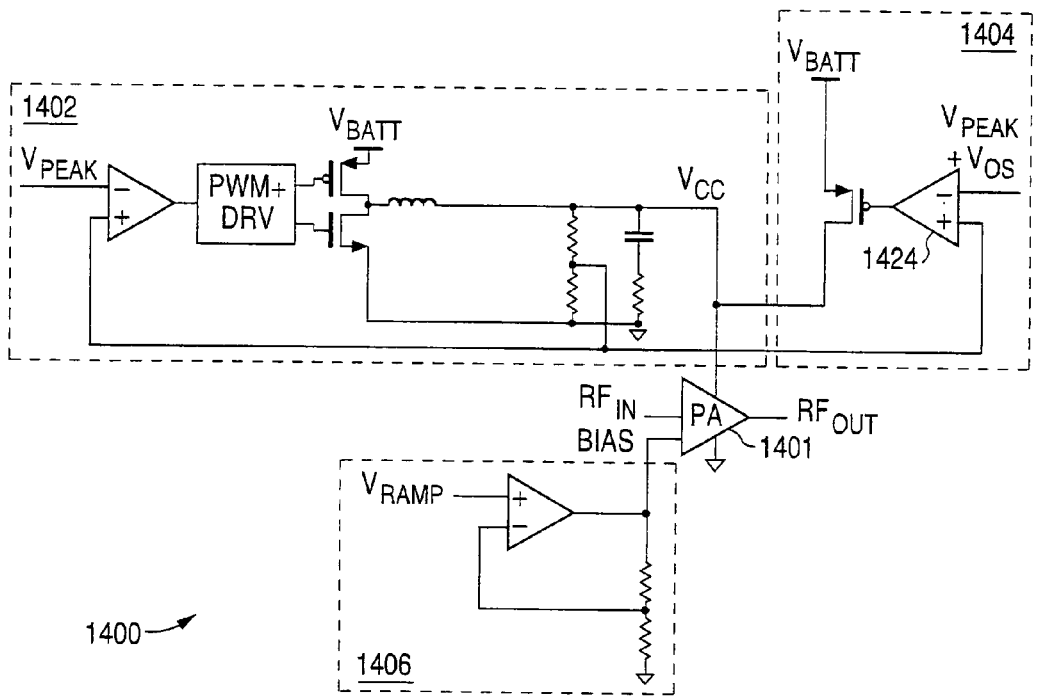

FIGS. 13 and 14 support envelope tracking using a linear amplifier controlling the bias of a power amplifier. This may be useful, for example, in WCDMA/UMTS applications. Envelope tracking could be supported in other ways as well, such as by achieving envelope tracking through an input RF signal $RF_{IN}$ of a power amplifier.

As shown in FIG. 13, a circuit 1300 includes a power amplifier 1301, a switcher 1302, and a linear amplifier 1306. In this example, the switcher 1302 may operate in the same or similar manner as various switchers described above. The switcher 1302 here provides its output directly to the power amplifier 1301 as the supply voltage $V_{CC}$. Also, the linear amplifier 1306 may operate in the same or similar manner as other linear amplifiers described above. In this embodiment, the linear amplifier 1306 provides its output as a bias to the power amplifier 1301.

In this example, the switcher's switching noise can be controlled to an acceptable level (such as through large LC components and/or spread-spectrum techniques). As a result, $V_{CC}$ can be provided by the switcher 1302 directly, and the power amplifier's bias can be controlled by the linear amplifier 1306. The linear amplifier 1306 can satisfy any time mask requirements and modulation bandwidths. This circuit 1300 could potentially provide higher efficiency and yet be simpler in terms of implementation. The power amplifier 1301 may require higher linearity, but the power amplifier efficiency can be quite good. The switcher 1302 may need to meet any spectral mask requirements even at low frequencies.

As shown in FIG. 14, a circuit 1400 includes a power amplifier 1401, a switcher 1402, and two linear amplifiers 1404-1406. In this example, the switcher 1402 may operate in the same or similar manner as various switchers described above. Also, the linear amplifiers 1404-1406 may operate in the same or similar manner as various linear amplifiers described above. However, the linear amplifier 1404 includes a difference amplifier 1424 that receives $V_{PEAK}$ plus $V_{OS}$ (an offset) as an input.

Again, in this example, the switcher's switching noise can be controlled to an acceptable level. Also, $V_{CC}$ can be provided by the switcher 1402 directly (if the entire load current can be provided by the switcher 1402) or by the switcher 1402 and linear amplifier 1404 directly (if the entire load current cannot be provided by the switcher 1402). Also, the power amplifier's bias can be controlled by the linear amplifier 1406.

Figure 15:
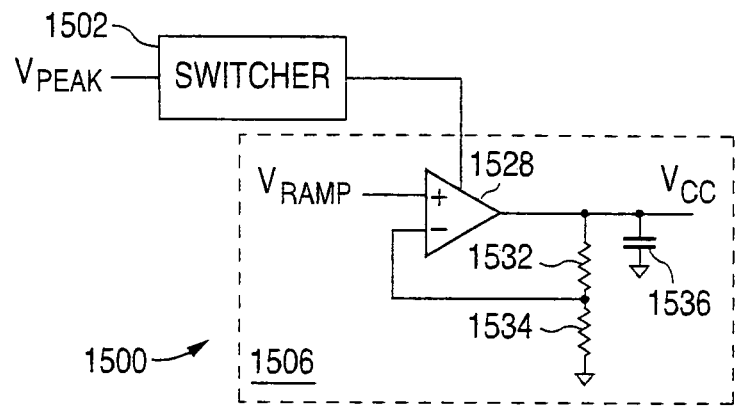
Figure 16:
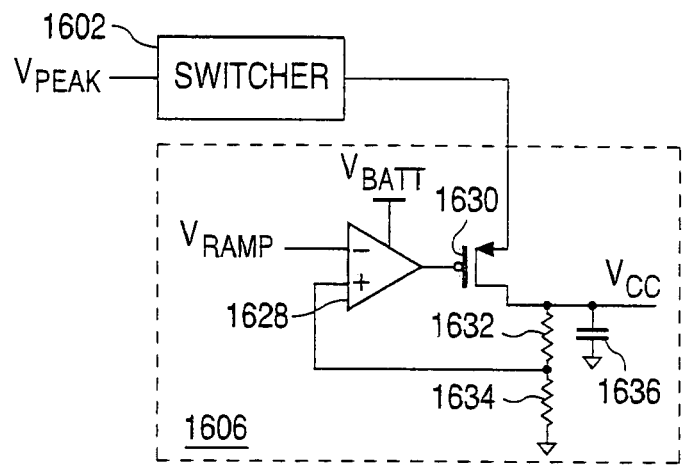

FIGS. 15 and 16 illustrate example implementations of a linear amplifier, which is coupled in series with a switcher. In FIG. 15, a circuit 1500 includes a switcher 1502 and a linear amplifier 1506 having a difference amplifier 1528, two resistors 1532-1534, and a capacitor 1536. The output of the switcher 1502 supplies the difference amplifier 1528, and the difference amplifier 1528 generates the supply voltage $V_{CC}$ at its output.

In FIG. 16, a circuit 1600 includes a switcher 1602 and a linear amplifier 1606 having a difference amplifier 1628, a PMOS transistor 1630, two resistors 1632-1634, and a capacitor 1636. Here, the output of the switcher 1602 is provided to the source of the transistor 1630, and the difference amplifier 1628 provides an output to the gate of the transistor 1630. The drain of the transistor 1630 provides the supply voltage $V_{CC}$. The difference amplifier 1628 is powered by $V_{BATT}$.

Various ones of the circuits shown and described above can be used in any suitable devices or systems, such as in a GSM/polar EDGE device or system. In this case, the output of the switcher in the circuit could be targeted slightly higher than the supply voltage $V_{CC}$ peak. Also, the linear amplifier outputting $V_{CC}$ in the circuit could provide the high bandwidth if it is not in the drop out condition, and any parallel linear amplifier in the circuit can provide the required bandwidth if the linear amplifier outputting $V_{CC}$ is in the drop out condition. In particular embodiments (such as in FIG. 13), when used in a GSM device or in GSM mode, the $V_{RAMP}$ steady state can be set to the constant bias independent of the $V_{CC}$ power levels (where $V_{RAMP}$ contains or represents the time mask), which may provide a simple implementation and high efficiency. These circuits can meet the various requirements for a practical GSM/EDGE RF power amplifier. These include receiver band noise requirements, such as −79 dBm at the 20 MHz offset and −67 dBm at the 10 MHz offset. Other requirements that can be met by these circuits include time mask requirements and dynamic voltage ranges and associated bandwidth requirements in the polar EDGE system. In addition, these circuits may be subjected to other requirements, such as low input voltages from newer battery technology.

In GSM/EDGE devices and systems, there may be a time window between consecutive GSM/EDGE bursts (such as a period of 22.15 μs). During these non-transmit states, the switcher can be placed in tri-state and consume no bias current. With essentially no leakage current, the switcher output capacitor can be kept near its steady state so that switcher startup time can be reduced or minimized for the next burst.

The various circuits shown and described above could also be used in other devices and systems, such as in CDMA or WCDMA devices and systems. In these embodiments, higher bandwidth requirements for power amplifier supplies may exist. Also, in these embodiments, the switcher can be used for peak or average power delivery, and linear amplifiers can be used to "correct" the switcher results.

In the various circuits shown and described above, the inputs to the circuits (such as $V_{RAMP}$ or $V_{PEAK}$) can be received in any suitable manner. In some embodiments, these inputs could be received over individual hard wires or through a serial interface, such as a Serial Peripheral Interface (SPI) or I²C bus.

The various circuits shown and described above can also be implemented in any suitable manner. For example, each circuit could be entirely integrated with a power amplifier except for passive components (inductors and capacitors). As another example, an entire control circuit could be implemented as a single chip except for the passive components. The various circuits could further be implemented modularly, and there could be numerous ways to partition the circuits. As a particular example, parallel linear amplifiers (such as amplifiers 604 and 704) could form part of a power amplifier module, which may be useful when the power amplifier module already includes an integrated linear amplifier. The remainder of the circuitry (except for the passive components) could be integrated as an external component that is coupled to the power amplifier, which may help to maintain a relative small die size. As another particular example, a standalone switcher could be used as an external component that can be coupled to different power amplifier modules and that can be time-multiplexed by a band selector, and the linear amplifiers could be integrated to fit into a power amplifier module. Any other or additional implementation could be used.

While this has described various embodiments of circuits for power and modulation control of a power amplifier, various changes could be made to these circuits. For example, different parts of different circuits could be combined into a single circuit. As a particular example, two linear amplifiers 604 could be used in the circuit 600, where one drives $V_{CC}$ and the other drives the switcher output whenever the switcher 602 is unable to provide sufficient headroom for the linear amplifier 606. The linear amplifier 604 driving $V_{CC}$ may use a larger output device than the switcher and the other linear amplifiers. As another particular example, the embodiment of a switcher in one figure could be used in conjunction with the embodiment(s) of switcher(s) in other figure(s). Also, while shown as using PWM, the circuits could use other control techniques, such as pulse frequency modulation (PFM). In addition, although not shown in the figures, various PMOS transistors (such as transistors 838 and 938) in the switchers and linear amplifiers could have NMOS transistors coupled in parallel. This may be needed since a PMOS transistor might not be turned on if the switcher output falls below a threshold (such as less than 1V), and the NMOS transistors can act as switches in these situations. The NMOS transistors could be small since they may only be used in low current conditions (low $V_{CC}$).

Figure 17:
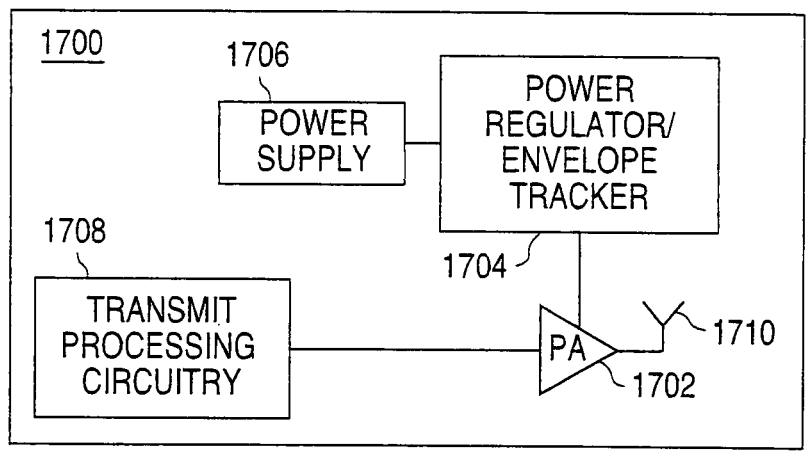
FIG. 17 illustrates an example device for transmitting wireless signals using a power amplifier.

FIG. 17 illustrates an example device 1700 for transmitting wireless signals using a power amplifier. The device 1700 could, for example, use one or more of the circuits shown and described above for power and modulation control of the power amplifier. The embodiment of the device 1700 shown in FIG. 17 is for illustration only. Other devices could use the circuits shown and described above to provide power and modulation control of a power amplifier without departing from the scope of this disclosure.

In this example, the device 1700 includes a transmitter that may be used in a wireless device (such as a mobile telephone or other mobile wireless device). The device 1700 includes a power amplifier 1702, a power regulator and envelope tracker 1704, and a power source 1706. The power regulator and envelope tracker 1704 could implement one or more of the circuits described above. The power regulator and envelope tracker 1704 is coupled between the power source 1706 and the power amplifier 1702. The power regulator and envelope tracker 1704 receives a voltage from the power source 1706 and provides a regulated power supply ($V_{CC}$) to the power amplifier 1702. The power regulator and envelope tracker 1704 also performs envelope tracking. The power supply 1706 could represent any suitable source of power, such as a battery that provides between 2.7V and 5.5V.

The device 1700 also includes transmit processing circuitry 1708 and an antenna 1710. The transmit processing circuitry 1708 represents circuitry for generating an RF or other signal that is provided to the power amplifier 1702 for amplification. The transmit processing circuitry 1708 could, for example, represent baseband circuitry, filters, and any other or additional components for generating a signal to be transmitted. The antenna 1710 is coupled to the power amplifier 1702. The antenna 1710 receives the signal generated by the power amplifier 1702 and transmits the signal over a wireless interface.

The power regulator and envelope tracker 1704 may operate in any suitable manner to control the power amplifier 1702. For example, the power regulator and envelope tracker 1704 may generate a supply voltage $V_{CC}$ for the power amplifier 1702. The power regulator and envelope tracker 1704 may also perform envelope tracking by fine tuning the supply voltage $V_{CC}$ or generating a bias for the power amplifier 1702. The power regulator 1704 may operate based on control signals received from any suitable source, such as the transmit processing circuitry 1708.

Although FIG. 17 illustrates one example of a device 1700 for transmitting wireless signals using a power amplifier, various changes could be made to FIG. 17. For example, the device 1700 could include any additional components, such as receive processing circuitry for processing an incoming wireless signal. Also, the various circuits shown above could be used in any other suitable device.

It may be advantageous to set forth definitions of certain words and phrases that have been used within this patent document. The term "couple" and its derivatives refer to any direct or indirect communication between two or more components, whether or not those components are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A circuit comprising:
 a power amplifier operable to receive an input signal and generate an amplified output signal;
 a switching converter operable to generate a regulated voltage and to perform power control for the power amplifier; and
 a linear amplifier operable to perform modulation envelope control for the power amplifier;
 wherein:
 the linear amplifier is operable to receive a ramp reference input voltage; and the switching converter is operable to receive a peak reference input voltage associated with a voltage that is at least as large as a peak value of the ramp reference input voltage.

2. The circuit of claim 1, wherein:
the switching converter is coupled in series with the linear amplifier;
the circuit is operable to operate in one of multiple modes;
the switching converter is operable to output the regulated voltage for the power amplifier in one of the modes; and
the linear amplifier is operable to receive the regulated voltage and output a tracked voltage for the power amplifier in another of the modes.

3. A circuit comprising:
a power amplifier operable to receive an input signal and generate an amplified output signal;
a switching converter operable to generate a regulated voltage and to perform power control for the power amplifier; and
a linear amplifier operable to perform modulation envelope control for the power amplifier;
wherein:
the switching converter is coupled in series with the linear amplifier;
the circuit is operable to operate in one of multiple modes;
the switching converter is operable to output the regulated voltage for the power amplifier in one of the modes;
the linear amplifier is operable to receive the regulated voltage and output a tracked voltage for the power amplifier in another of the modes; and
the linear amplifier is operable to output the tracked voltage by tuning the regulated voltage to track a reference input voltage and outputting the tracked voltage to the power amplifier.

4. The circuit of claim 1, wherein:
the switching converter is coupled in series with the linear amplifier;
the circuit is operable to operate in one of multiple modes; and
the linear amplifier is operable to receive the regulated voltage and output a tracked voltage for the power amplifier in each of the modes.

5. A circuit comprising:
a power amplifier operable to receive an input signal and generate an amplified output signal;
a switching converter operable to generate a regulated voltage and to perform power control for the power amplifier; and
a linear amplifier operable to perform modulation envelope control for the power amplifier;
wherein:
the switching converter is coupled in series with the linear amplifier;
the circuit is operable to operate in one of multiple modes;
the linear amplifier is operable to receive the regulated voltage and output a tracked voltage for the power amplifier in each of the modes; and
the switching converter comprises:
a difference amplifier operable to receive a reference input voltage and a second input voltage; and
a selector operable to provide the second input voltage to the difference amplifier, the second input voltage comprising one of: (i) a voltage generated within the switching converter and (ii) a voltage generated within the linear amplifier, depending on the mode of the circuit.

6. A circuit comprising:
a power amplifier operable to receive an input signal and generate an amplified output signal;
a switching converter operable to generate a regulated voltage and to perform power control for the power amplifier; and
a linear amplifier operable to perform modulation envelope control for the power amplifier;
wherein:
the switching converter is operable to provide the regulated voltage directly to the power amplifier; and
the linear amplifier is operable to adjust a bias of the power amplifier to provide envelope tracking for the power amplifier.

7. The circuit of claim 1, wherein the peak reference input voltage comprises one of: (i) a voltage that is higher than the peak value of the ramp reference input voltage and (ii) a scaled version of the voltage that is higher than the peak value of the ramp reference input voltage.

8. The circuit of claim 1, wherein the ramp reference input voltage contains modulation envelope information.

9. A circuit comprising:
a power amplifier operable to receive an input signal and generate an amplified output signal;
a switching converter operable to generate a regulated voltage and to perform power control for the power amplifier; and
a first linear amplifier operable to perform modulation envelope control for the power amplifier; and
a second linear amplifier coupled in parallel with at least the switching converter.

10. The circuit of claim 9, wherein:
the switching converter is operable to provide at least part of a load current for the power amplifier; and
the second linear amplifier is operable to provide additional load current for the power amplifier when the switching converter is unable to provide all of the load current.

11. The circuit of claim 9, wherein:
the switching converter comprises an output capacitance; and
the second linear amplifier is operable to at least partially charge the output capacitance of the switching converter.

12. The circuit of claim 1, wherein:
a supply voltage is supplied to the switching converter; and
the regulated voltage is larger than the supply voltage.

13. The circuit of claim 1, wherein the switching converter is operable to be configured in buck mode or boost mode depending on a voltage supplied to the switching converter.

14. A circuit comprising:
a power amplifier operable to receive an input signal and generate an amplified output signal;
a switching converter operable to generate a regulated voltage and to perform power control for the power amplifier; and
a linear amplifier operable to perform modulation envelope control for the power amplifier;
wherein:
the switching converter is operable to receive an enable signal enabling the generation of the regulated voltage; and
the switching converter is operable to enter a steady state before the linear amplifier is enabled.

15. A wireless device comprising:
a power amplifier;
transmit processing circuitry operable to generate a signal to be amplified by the power amplifier;
an antenna operable to transmit the signal generated by the transmit processing circuitry and amplified by the power amplifier; and
power and modulation control circuitry comprising:
- a switching converter operable to generate a regulated voltage and to perform power control for the power amplifier; and
- a linear amplifier operable to perform modulation envelope control for the power amplifier;

wherein:
- the linear amplifier is operable to receive a ramp reference input voltage; and
- the switching converter is operable to receive a peak reference input voltage associated with a voltage that is at least as large as a peak value of the ramp reference input voltage.

16. The wireless device of claim 15, wherein:
the switching converter is coupled in series with the linear amplifier;
the wireless device is operable to operate in one of multiple modes;
the switching converter is operable to output the regulated voltage for the power amplifier in one of the modes; and
the linear amplifier is operable to receive the regulated voltage and output a tracked voltage for the power amplifier in another of the modes.

17. The wireless device of claim 15, wherein:
the switching converter is coupled in series with the linear amplifier;
the wireless device is operable to operate in one of multiple modes; and
the linear amplifier is operable to receive the regulated voltage and output a tracked voltage for the power amplifier in each of the modes.

18. The wireless device of claim 17, wherein the switching converter comprises:
a difference amplifier operable to receive a reference input voltage and a second input voltage; and
a selector operable to provide the second input voltage to the difference amplifier, the second input voltage comprising one of: (i) a voltage generated within the switching converter and (ii) a voltage generated within the linear amplifier depending on the mode of the circuit.

19. The wireless device of claim 15, wherein:
the switching converter is operable to provide the regulated voltage directly to the power amplifier; and
the linear amplifier is operable to adjust a bias of the power amplifier to provide envelope tracking for the power amplifier.

20. A method comprising:
receiving an input signal and generating an amplified output signal using a power amplifier;
generating a regulated voltage and performing power control for the power amplifier using a switching converter; and
performing modulation envelope control for the power amplifier using a linear amplifier, the linear amplifier receiving a ramp reference input voltage;
wherein the switching converter receives a peak reference input voltage associated with a voltage that is at least as large as a peak value of the ramp reference input voltage.

* * * * *